United States Patent
Smith et al.

(10) Patent No.: US 12,180,591 B2
(45) Date of Patent: Dec. 31, 2024

(54) CERAMIC MATRIX COMPOSITE SURFACE ROUGHNESS

(71) Applicant: RTX Corporation, Farmington, CT (US)

(72) Inventors: Ashley A. Smith, Royal Palm Beach, FL (US); Andrew J. Lazur, Laguna Beach, CA (US); Howard J. Liles, Newington, CT (US)

(73) Assignee: RTX CORPORATION, Farmington, CT (US)

( * ) Notice: Subject to any disclaimer, the term of this patent is extended or adjusted under 35 U.S.C. 154(b) by 78 days.

(21) Appl. No.: 17/587,354

(22) Filed: Jan. 28, 2022

(65) Prior Publication Data

US 2023/0243037 A1  Aug. 3, 2023

(51) Int. Cl.
*C23C 16/52* (2006.01)
*C23C 16/02* (2006.01)
*C23C 16/04* (2006.01)
*C23C 16/56* (2006.01)

(52) U.S. Cl.
CPC .......... *C23C 16/52* (2013.01); *C23C 16/0272* (2013.01); *C23C 16/045* (2013.01); *C23C 16/56* (2013.01)

(58) Field of Classification Search
None
See application file for complete search history.

(56) References Cited

U.S. PATENT DOCUMENTS

| | | | |
|---|---|---|---|
| 10,774,010 B2 | 9/2020 | Shim et al. | |
| 2003/0196305 A1 | 10/2003 | Kebbede et al. | |
| 2014/0272310 A1 | 9/2014 | Lazur et al. | |
| 2019/0338666 A1* | 11/2019 | Finn | G06T 3/4038 |
| 2021/0354253 A1* | 11/2021 | Whittle | F01D 5/288 |

OTHER PUBLICATIONS

Search Report issued in European Patent Application No. 23153491.8; Application Filing Date Jan. 26, 2023; Date of Mailing Jun. 27, 2023 (8 pages).

* cited by examiner

*Primary Examiner* — Shamim Ahmed
*Assistant Examiner* — Bradford M Gates
(74) *Attorney, Agent, or Firm* — CANTOR COLBURN LLP

(57) ABSTRACT

A method of improving surface roughness of ceramic matrix composites (CMCs) is provided. The method includes completing a formation of the CMCs and a chemical vapor infiltration (CVI) process to initially coat the CMCs, inspecting a CMC surface, identifying, from a result of the inspecting, a defect in the CMC surface that negatively impacts a surface roughness characteristic thereof, locally targeting and ablating the defect and re-inspecting the CMC surface to ensure that the defect is correct.

13 Claims, 6 Drawing Sheets

CERAMIC MATRIX COMPOSITE SURFACE ROUGHNESS

BACKGROUND

The present disclosure relates to improving surface roughness for ceramic matrix composites (CMCs) used in gas turbine engine components and, more particularly, to the use of laser machining or another suitable type of machining to improve CMC surface roughness of gas turbine engine components.

Recently, ceramic matrix composites (CMCs) have been proposed as materials for components of gas turbine engines, such as blades and vanes. CMCs are a subgroup of composite materials and a subgroup of ceramics. They include ceramic fibers embedded in a ceramic matrix. The ceramic fibers and the matrix both can include any ceramic material. As compared to metallic materials that have been traditionally used in gas turbine engines, CMCs can offer improved strength and heat resistance as well as reduced weight.

When CMCs are used as materials for gas turbine engine components, such as blades and vanes, CMCs are generally laid down in various patterns over mandrels or other support structures in order to form the blade or vane shapes. The CMCs are then repeatedly compressed and heated until the desired blade or vane shape is achieved.

While CMCs offer certain advantages over metallic materials for gas turbine engine components, such as blade and vanes, the formation process remains difficult to perform and can result in surfaces that cannot be coated as needed for use in high-temperature and high-pressure environments. Previously, this issue has been handled manually, using machining tools that are inherently messy and require significant cleanup, and often resulted in sub-optimal results.

Accordingly, a need exists for a method or system to improve CMC surface roughness of gas turbine engine components.

BRIEF DESCRIPTION

According to an aspect of the disclosure, a method of improving surface roughness of ceramic matrix composites (CMCs) is provided. The method includes completing a formation of the CMCs and a chemical vapor infiltration (CVI) process to initially coat the CMCs, inspecting a CMC surface, identifying, from a result of the inspecting, a defect in the CMC surface that negatively impacts a surface roughness characteristic thereof, locally targeting and ablating the defect and re-inspecting the CMC surface to ensure that the defect is correct.

In accordance with additional or alternative embodiments, the inspecting, the locally targeting and ablating and the reinspecting includes programing tooling to follow a macroscopic contour of the CMC surface and to follow a microscopic contour of the CMCs.

In accordance with additional or alternative embodiments, the inspecting includes one of a structured light inspection and a digital inspection.

In accordance with additional or alternative embodiments, the inspecting is executed at a resolution of about $2/10000"$.

In accordance with additional or alternative embodiments, the defect includes one of a gross deviation from a nominal shape and a high point.

In accordance with additional or alternative embodiments, the ablating includes laser machining to smooth the CMC surface at and around a location of the defect.

In accordance with additional or alternative embodiments, the ablating includes an abrasive process to smooth the CMC surface at and around a location of the defect.

In accordance with additional or alternative embodiments, the method further includes repeating the CVI process at and around a location of the defect to re-initially coat the CMCs at and around the location of the defect.

In accordance with additional or alternative embodiments, the method further includes applying an environmental barrier coating (EBC) comprising a bond coat and a top coat to the CMC surface and repeating the inspecting, the identifying, the locally targeting and ablating and the re-inspecting with respect to defects in the EBC.

According to an aspect of the disclosure, a method of improving surface roughness of an aerodynamic component formed of ceramic matrix composites (CMCs) is provided. The method includes completing a formation of the aerodynamic component formed of the CMCs and a chemical vapor infiltration (CVI) process to initially coat the CMCs, inspecting a CMC surface of the aerodynamic component, identifying, from a result of the inspecting, a defect in the CMC surface that negatively impacts a surface roughness characteristic thereof, locally targeting and ablating the defect and re-inspecting the surface to ensure that the defect is corrected.

In accordance with additional or alternative embodiments, the aerodynamic component includes one of a vane, an airfoil and a blade outer air seal (BOAS) of a gas turbine engine.

In accordance with additional or alternative embodiments, the inspecting, the locally targeting and ablating and the reinspecting comprises programing tooling to follow a macroscopic contour of the CMC surface and to follow a microscopic contour of the CMCs.

In accordance with additional or alternative embodiments, the inspecting includes one of a structured light inspection and a digital inspection.

In accordance with additional or alternative embodiments, the inspecting is executed at a resolution of about $2/10000"$.

In accordance with additional or alternative embodiments, the defect includes one of a gross deviation from a nominal shape and a high point.

In accordance with additional or alternative embodiments, the ablating includes laser machining to smooth the CMC surface at and around a location of the defect.

In accordance with additional or alternative embodiments, the ablating includes an abrasive process to smooth the CMC surface at and around a location of the defect.

In accordance with additional or alternative embodiments, the method further includes repeating the CVI process at and around a location of the defect to re-initially coat the CMCs at and around the location of the defect.

In accordance with additional or alternative embodiments, the method further includes applying an environmental barrier coating (EBC) comprising a bond coat and a top coat to the CMC surface and repeating the inspecting, the identifying, the locally targeting and ablating and the re-inspecting with respect to defects in the EBC.

According to an aspect of the disclosure, a surface formed of ceramic matrix composites (CMCs) is provided and includes weaved CMC fibers and a bond coat applied to upper surfaces of the weaved CMC fibers. The weaved CMC fibers and the bond coat have a macroscopic contour and a microscopic undulating contour including locally smoothed sections.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
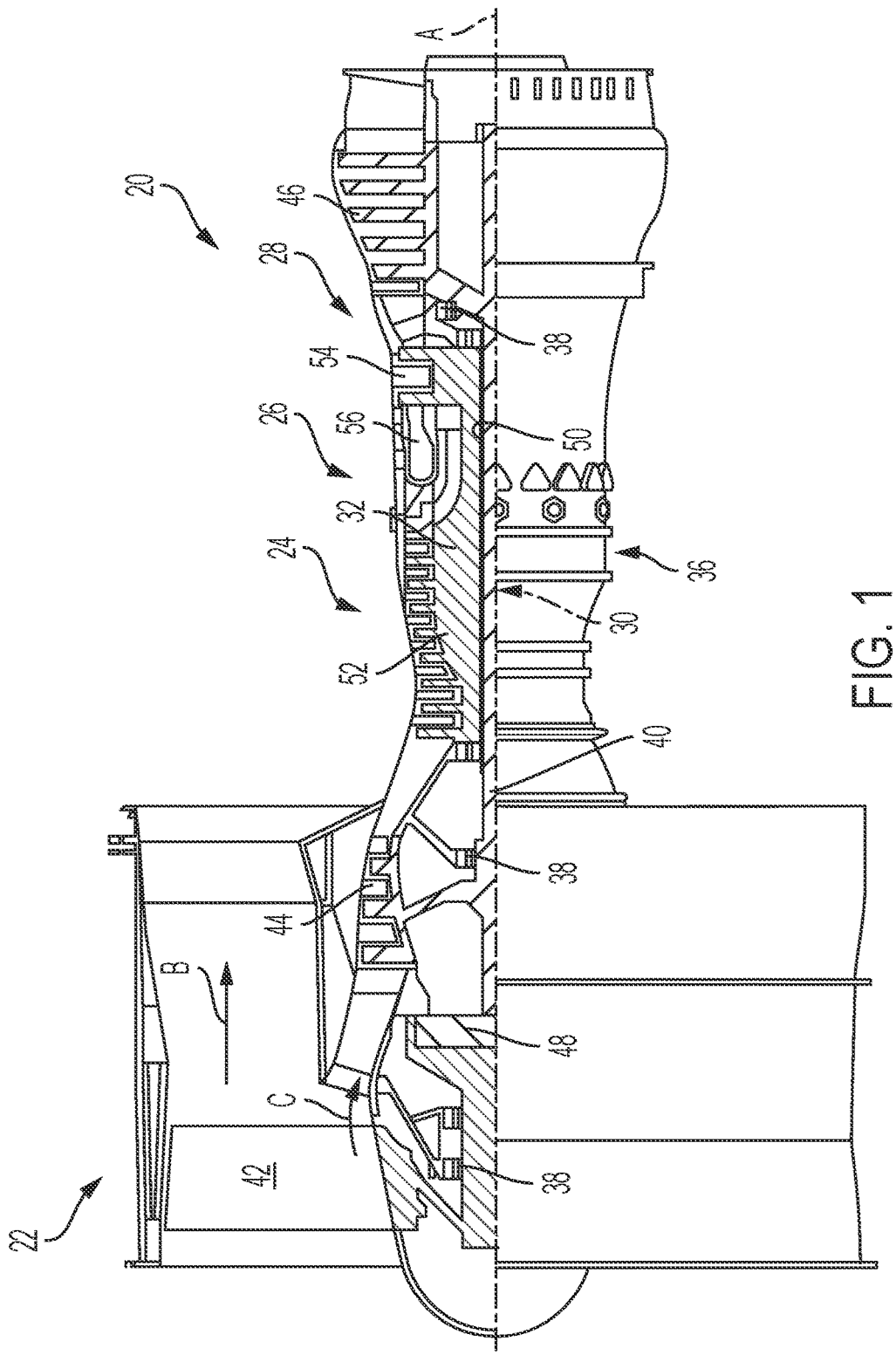
FIG. 1 a partial cross-sectional illustration of a gas turbine engine according to a non-limiting embodiment.

With reference now to FIG. 1, a gas turbine engine 20 is illustrated according to a non-limiting embodiment. The gas turbine engine 20 is disclosed herein as a multi-spool turbofan that generally incorporates a fan section 22, a compressor section 24, a combustor section 26 and a turbine section 28. Alternative engines might include other systems or features. The fan section 22 drives air along a bypass flow path B in a bypass duct, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with multi-spool turbofans as the teachings may be applied to other types of turbine engines including, for example, three-spool architectures.

The exemplary engine 20 generally includes one or more low-spool generator machines 30, referred to herein as a "low-spool" 30 and a high-spool generator machine 32, referred to herein as a "high-spool 32" mounted for rotation about an engine central longitudinal axis (A) relative to an engine static structure 36 via several bearing systems 38. It should be understood that various bearing systems 38 at various locations may alternatively or additionally be provided, and the location of bearing systems 38 may be varied as appropriate to the application.

The low-spool 30 generally includes an inner shaft 40 that interconnects a fan 42, a low-pressure compressor 44 and a low-pressure turbine 46. The inner shaft 40 is connected to the fan 42 through a speed change mechanism, which in exemplary gas turbine engine 20 is illustrated as a geared architecture 48 to drive the fan 42 at a lower speed than the low-spool 30. The high-spool 32 includes an outer shaft 50 that interconnects a high-pressure compressor 52 and high-pressure turbine 54. A combustor 56 is arranged in exemplary gas turbine 20 between the high-pressure compressor 52 and the high-pressure turbine 54. An engine static structure 36 is arranged generally between the high-pressure turbine 54 and the low-pressure turbine 46. The engine static structure 36 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low-pressure compressor 44 then the high-pressure compressor 52, mixed and burned with fuel in the combustor 56, then expanded over the high-pressure turbine 54 and low-pressure turbine 46. The turbines 46, 54 rotationally drive a respective low-spool 30 and high-spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low-pressure turbine 46 has a pressure ratio that is greater than about five. In one disclosed embodiment, the engine 20 bypass ratio is greater than about ten (10:1), the fan diameter is significantly larger than that of the low-pressure compressor 44, and the low-pressure turbine 46 has a pressure ratio that is greater than about five 5:1. Low-pressure turbine 46 pressure ratio is pressure measured prior to inlet of low-pressure turbine 46 as related to the pressure at the outlet of the low-pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present disclosure is applicable to other gas turbine engines including direct drive turbofans.

While the example of FIG. 1 illustrates one example of the gas turbine engine 20, it will be understood that any number of spools, inclusion or omission of the gear system 48, and/or other elements and subsystems are contemplated. Further, rotor systems described herein can be used in a variety of applications and need not be limited to gas turbine engines for aircraft applications. For example, rotor systems can be included in power generation systems, which may be ground-based as a fixed position or mobile system, and other such applications.

As will be described below, a structured light inspection or a digital inspection is completed on one or more components of the gas turbine engine 20 of FIG. 1, which are made with CMCs, such as a vane, an airfoil and/or a blade outer air seal (BOAS). The structured light inspection or the digital inspection would be done after chemical vapor infiltration (CVI) processes and feature machining are complete.

The part in question would be inspected, and the resulting report would highlight gross deviations or high points on its surface. Utilizing laser machining or another suitable process, high points would be locally targeted and ablated to achieve a more uniform surface profile. After machining, the part would be re-inspected to ensure the result was achieved. The inspection, ablation and re-inspection processes could also be utilized throughout coating processes.

In greater detail, current CMC processes can yield a part with waviness and roughness that can negatively impact part performance due to the preforming process and broken fibers on the surface which become rigidized during the CVI process. While a CMC part is typically machined post-CVI, this machining usually focuses on creating features or removing excess material. Here instead, the focus would be on smoothing gas path surfaces by first inspecting the part via a structured light or digital inspection to identify the high points that can impact the surface roughness and waviness the most, and then targeting these points with the laser. By targeting and removing/reducing these high point areas, the expected result is a smoother CMC surface for an environmental barrier coating (EBC) to be applied. The processes described herein could also be utilized post-EBC bond coating and post-EBC top coating if the structured light or digital inspection results show high deviation points on the surface.

Figure 2:
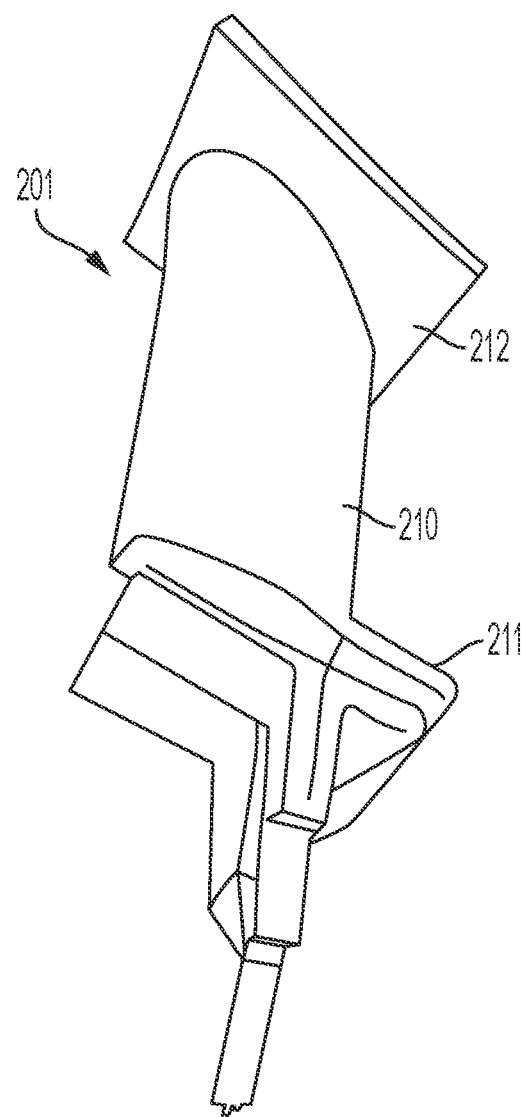
FIG. 2 is a perspective view of a vane of a gas turbine engine that is at least partially formed of ceramic matrix composites (CMCs) in accordance with embodiments.
Figure 3:
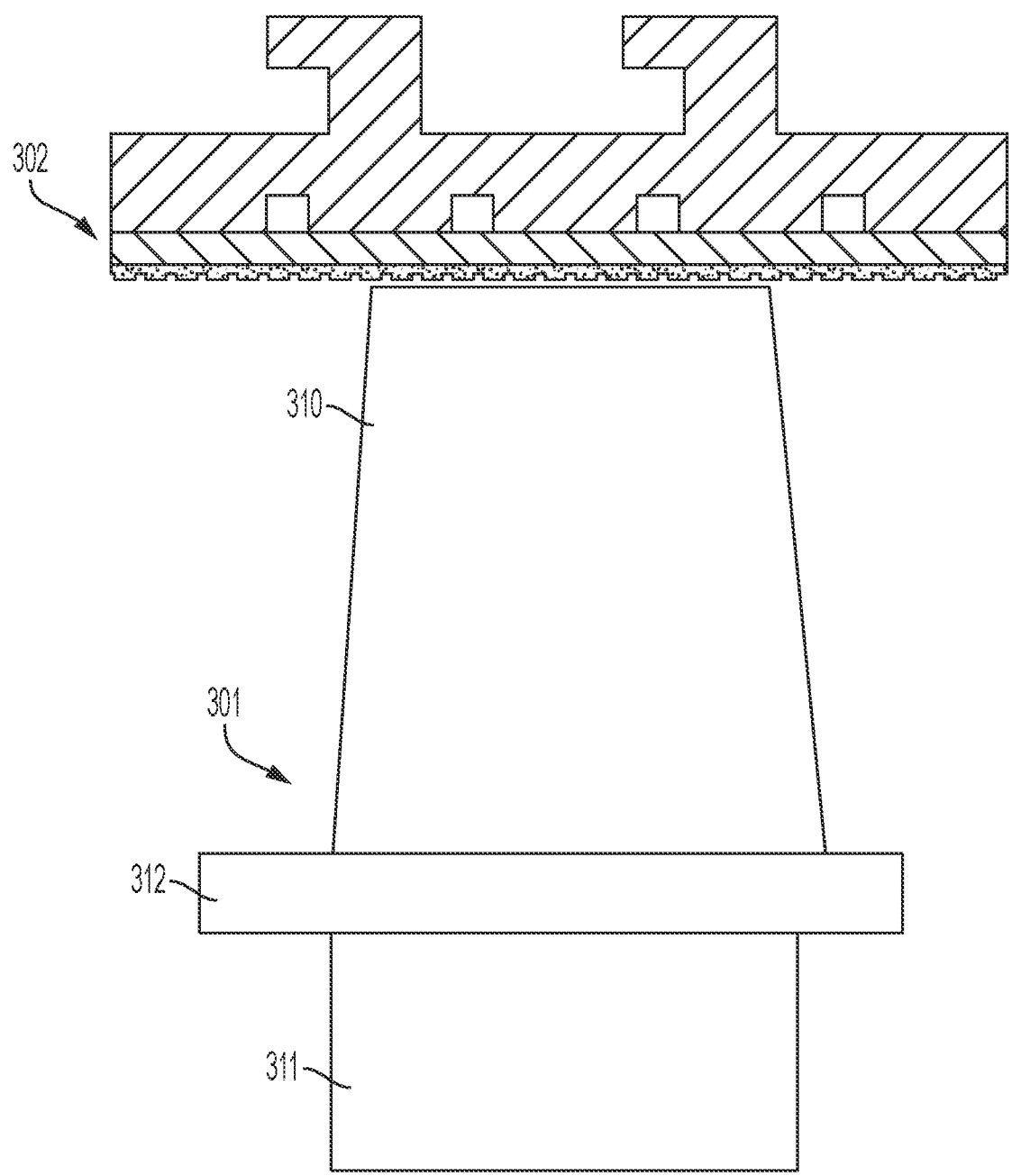
FIG. 3 is a side view of an airfoil and a blade outer air seal (BOAS) of a gas turbine engine that are at least partially formed of ceramic matrix composites (CMCs) in accordance with embodiments.

With reference to FIGS. 2 and 3, the gas turbine engine 20 of FIG. 1 can include many components that are made with CMCs. These include, but are not limited to, a vane 201 (see FIG. 2), an airfoil 301 (see FIG. 3) and a BOAS 302 (see FIG. 3).

As shown in FIG. 2, the vane 201 can be operably disposed in the compressor section 24 or the turbine section 28 and includes an airfoil section 210 radially interposed between an inner platform 211 and an outer platform 212. The airfoil section 210 has leading and trailing edges and pressure and suction surfaces extending between the leading and trailing edges. At least the airfoil section 210, the inner platform 211 and the outer platform 212 have gas path facing surfaces that are formed of CMCs. These gas path facing surfaces face toward high-temperature and high-pressure gas paths and thus need to have an EBC applied thereto.

As shown in FIG. 3, the airfoil 301 and the BOAS 302 can be operably disposed in the compressor section 24 or the turbine section 28. The airfoil 301 includes an airfoil section 310, a root 311 and a platform 312 that is radially interposed between the root 311 and the airfoil section 310. The airfoil section 310 has leading and trailing edges and pressure and suction surfaces extending between the leading and trailing edges. At least the airfoil section 310 and the platform 312 have gas path facing surfaces that are formed of CMCs. These gas path facing surfaces face toward high-temperature and high-pressure gas paths and thus need to have an EBC applied thereto. The BOAS 302 can be disposed to face the distal tip of the airfoil section 310 and has gas path facing surfaces that are formed of CMCs. As above, these gas path facing surfaces face toward high-temperature and high-pressure gas paths and thus need to have an EBC applied thereto.

Figure 4:
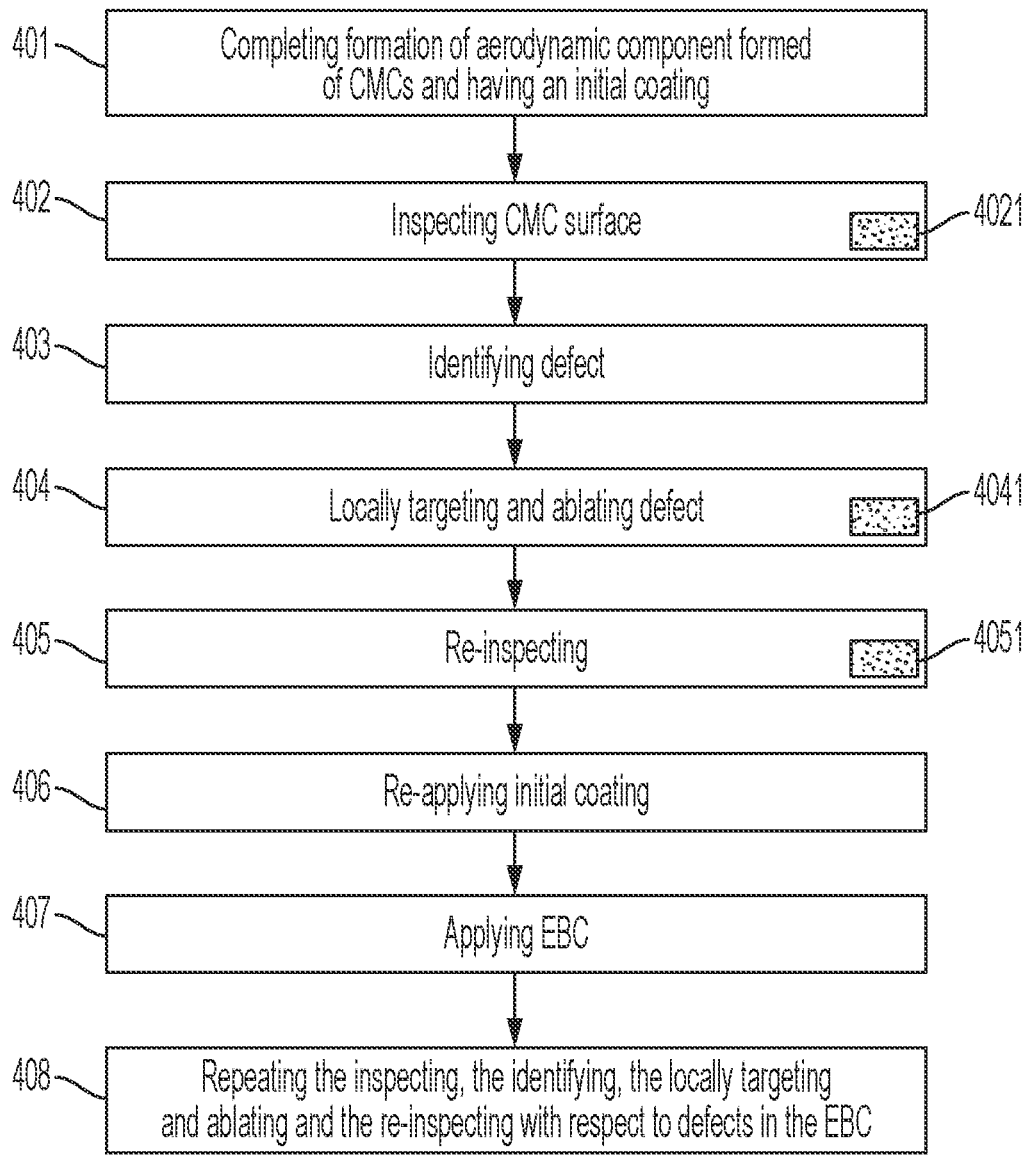
FIG. 4 is a flow diagram illustrating a method of improving surface roughness of an aerodynamic component formed of ceramic matrix composites (CMCs) in accordance with embodiments.

With reference to FIG. 4, a method of improving surface roughness of an aerodynamic component, such as the vane 201 of FIG. 2, the airfoil 301 of FIG. 3 or the BOAS of FIG. 3, is provided where at least a surface of the aerodynamic component is formed of CMCs. As shown in FIG. 4. The method can include completing a formation of the aerodynamic component formed of the CMCs and a CVI process to initially coat the CMCs (block 401) and inspecting a CMC surface of the aerodynamic component by one of a structured light inspection and a digital inspection or another similar inspection method (402) at a resolution of up to ²⁄₁₀₀₀₀". The method can further include identifying, from a result of the inspecting, a defect, such as one of a gross deviation from a nominal shape and a high point in the CMC surface, that negatively impacts a surface roughness characteristic thereof (block 403) and locally targeting and ablating the defect (block 404) by laser machining or some other suitable abrasive process to smooth the CMC surface at and around a location of the defect. Following the locally targeting and ablating of operation 404, the method includes re-inspecting the surface to ensure that the defect is corrected (block 405).

Since the ablating of operation 404 can remove at least a portion of the initial coating by the CVI, the method can also include repeating the CVI process at and around a location of the defect to re-initially coat the CMCs at and around the location of the defect (block 406). This can be followed by the applying of an environmental barrier coating (EBC) including a bond coat and a top coat to the CMC surface (407) and, in some cases, repeating the inspecting, the identifying, the locally targeting and ablating and the re-inspecting with respect to defects in the EBC (408).

In accordance with embodiments, the inspecting of operation 402, the locally targeting and ablating of operation 404 and the reinspecting of operation 405 can be executed automatically by various tooling and can include programming the various tooling to follow a macroscopic contour of the CMC surface and to follow a microscopic contour of the CMCs (blocks 4021, 4041 and 4051). The macroscopic contour of the CMC surface is the overall contour of the aerodynamic component (i.e., where the aerodynamic component is the airfoil 301 of FIG. 3 and the CMC surface is a portion of the pressure surface thereof, the macroscopic contour is that of pressure surface contouring). The microscopic contour follows the macroscopic contour and generally includes undulations formed by the weaved fibers of the CMC surface.

Figure 5:
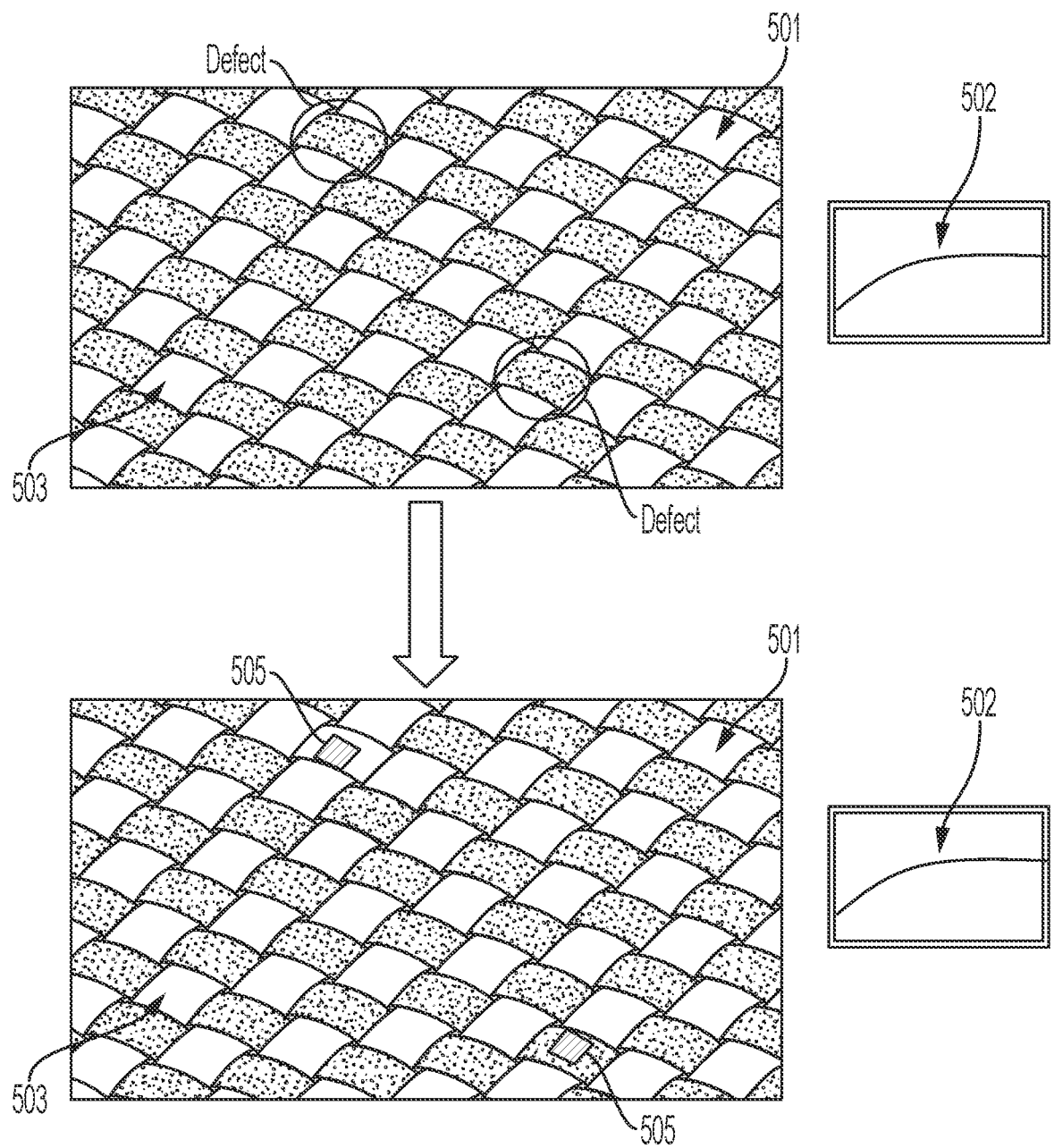
FIG. 5 is a graphical depiction of the method of FIG. 4 in accordance with embodiments.
Figure 6:
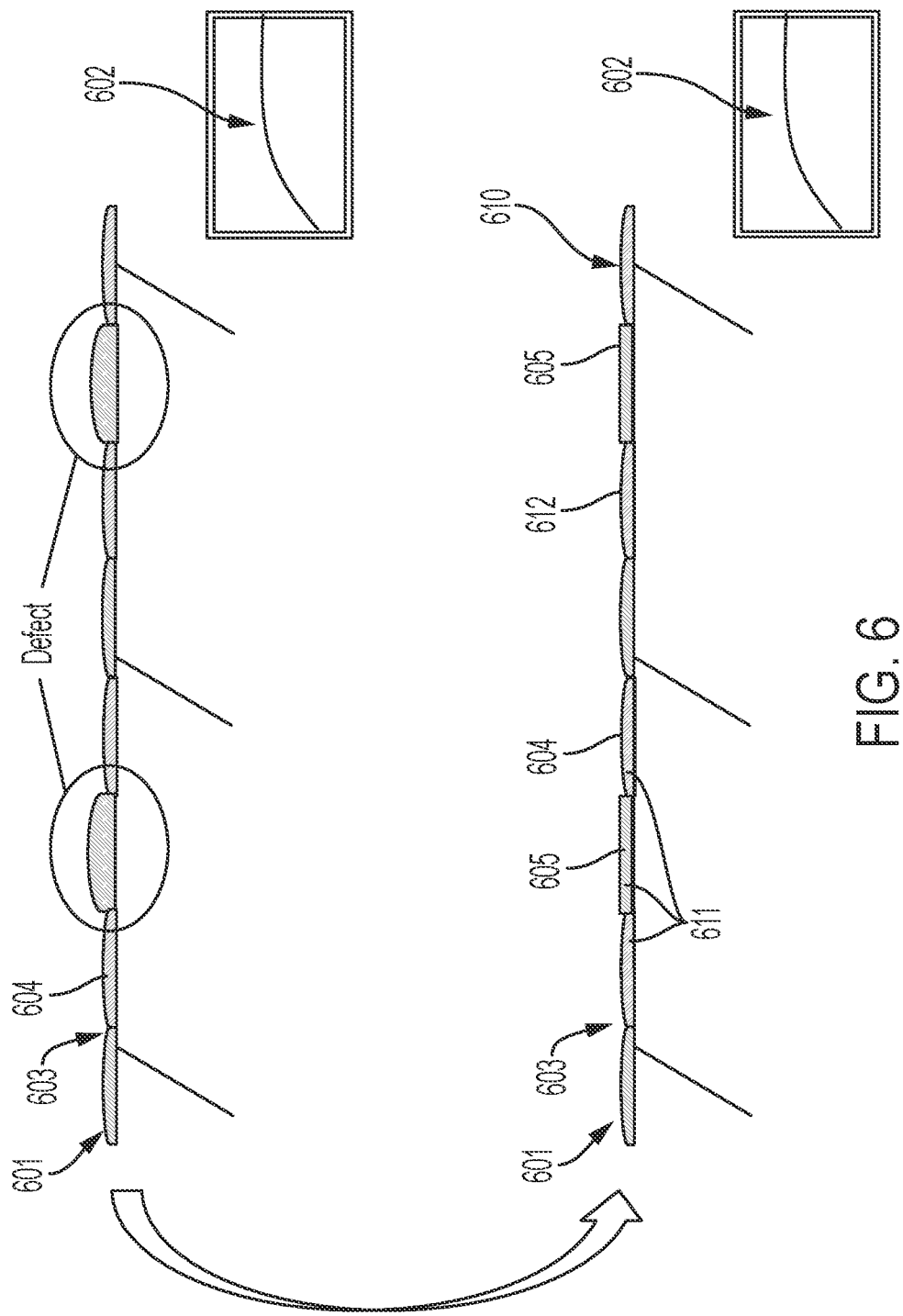
FIG. 6 is a graphical depiction of the method of FIG. 4 and illustrates a surface formed of ceramic matrix composites (CMCs) in accordance with embodiments.

The method of FIG. 4 is illustrated in FIGS. 5 and 6, which both show a CMC surface 501/601 that has a macroscopic contour 502/602 and a microscopic contour 503/603 and a coating 604 (not shown in FIG. 5). The microscopic contour 503/603 can be a microscopically undulating contour that, at least initially, has certain defects (i.e., high points). These defects are identified from an inspection and are ablated as illustrated into locally smooth sections 505/605.

With continued reference to FIG. 6, a surface 610 that is formed of CMCs is provided. The surface 610 includes weaved CMC fibers 611 and a bond coat 612 applied to upper surfaces of the weaved CMC fibers 611. The weaved CMC fibers 611 and the bond coat 612 have a macroscopic contour 602 and a microscopic undulating contour 603 that includes locally smoothed sections 605.

Technical effects and benefits of the present disclosure provide for a reduction of the high points on a CMC substrate before coating the part to thereby create a surface profile that is more uniform as the peak-to-valley height and peak count is reduced. In so improving the surface roughness of the part, this should improve coating durability as the coating is applied to a relatively smooth surface, and as a result overall part durability is increased which in turn positively improves the CMC part performance. The processes described herein differ meaningfully from conventional processes as the focus here is on using a machining method to smooth gas path surfaces of a part made with CMCs instead of creating machining features. Additionally, this creates a more controlled method to improve surface smoothing on the CMC substrate and EBC coated CMC, versus previous manual methods.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of improving surface roughness of ceramic matrix composites (CMCs), the method comprising:
    completing a formation of the CMCs and a chemical vapor infiltration (CVI) process to initially coat the CMCs;
    inspecting a CMC surface;
    identifying, from a result of the inspecting, a defect in the CMC surface in a form of a deviation of a fiber of the CMC surface from a nominal shape of the fiber that negatively impacts a surface roughness characteristic thereof;
    locally targeting and ablating the defect by smoothing the fiber of the CMC surface; and
    re-inspecting the CMC surface to ensure that the defect is corrected,
    wherein the ablating comprises one of laser machining and an abrasive process to smooth the fiber of the CMC surface at and around a location of the defect without smoothing neighboring fibers.

2. The method according to claim 1, wherein the inspecting, the locally targeting and ablating and the reinspecting comprises programming tooling to follow a macroscopic contour of the CMC surface and to follow a microscopic contour of the fiber and other fibers of the CMCs of the CMC surface.

3. The method according to claim 1, wherein the inspecting comprises one of a structured light inspection and a digital inspection.

4. The method according to claim 1, wherein the inspecting is executed at a resolution of about 2/10000".

5. The method according to claim 1, further comprising repeating the CVI process at and around a location of the defect to re-initially coat the CMCs at and around the location of the defect.

6. The method according to claim 1, further comprising:
    applying an environmental barrier coating (EBC) comprising a bond coat and a top coat to the CMC surface; and
    repeating the inspecting, the identifying, the locally targeting and ablating and the re-inspecting with respect to defects in the EBC.

7. A method of improving surface roughness of an aerodynamic component formed of ceramic matrix composites (CMCs), the method comprising:
    completing a formation of the aerodynamic component formed of the CMCs and a chemical vapor infiltration (CVI) process to initially coat the CMCs;
    inspecting a CMC surface of the aerodynamic component;
    identifying, from a result of the inspecting, a defect in the CMC surface in a form of a deviation of a fiber of the CMC surface from a nominal shape of the fiber that negatively impacts a surface roughness characteristic thereof;
    locally targeting and ablating the defect by smoothing the fiber of the CMC surface; and
    re-inspecting the surface to ensure that the defect is corrected,
    wherein the ablating comprises one of laser machining and an abrasive process to smooth the fiber of the CMC surface at and around a location of the defect without smoothing neighboring fibers.

8. The method according to claim 7, wherein the aerodynamic component comprises one of a vane, an airfoil and a blade outer air seal (BOAS) of a gas turbine engine.

9. The method according to claim 7, wherein the inspecting, the locally targeting and ablating and the reinspecting comprises programing tooling to follow a macroscopic contour of the CMC surface and to follow a microscopic contour of the fiber and other fibers of the CMCs of the CMC surface.

10. The method according to claim 7, wherein the inspecting comprises one of a structured light inspection and a digital inspection.

11. The method according to claim 7, wherein the inspecting is executed at a resolution of about 2/10000".

12. The method according to claim 7, further comprising repeating the CVI process at and around a location of the defect to re-initially coat the CMCs at and around the location of the defect.

13. The method according to claim 7, further comprising:
    applying an environmental barrier coating (EBC) comprising a bond coat and a top coat to the CMC surface; and
    repeating the inspecting, the identifying, the locally targeting and ablating and the re-inspecting with respect to defects in the EBC.

* * * * *